US008719753B1

United States Patent
Chow et al.

(10) Patent No.: US 8,719,753 B1
(45) Date of Patent: May 6, 2014

(54) STACKED DIE NETWORK-ON-CHIP FOR FPGA

(75) Inventors: Francis Man-Chit Chow, San Jose, CA (US); Rakesh H. Patel, Cupertino, CA (US); Erhard Joachim Pistorius, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 558 days.

(21) Appl. No.: 12/703,681

(22) Filed: Feb. 10, 2010

Related U.S. Application Data (62) Division of application No. 12/074,467, filed on Mar. 3, 2008, now Pat. No. 7,701,252.

(60) Provisional application No. 61/002,162, filed on Nov. 6, 2007.

(51) Int. Cl.
*G06F 17/50* (2006.01)

(52) U.S. Cl.
USPC .............. 716/116; 716/55; 716/126; 716/139

(58) Field of Classification Search
CPC ................................. G06F 17/50; G06F 15/04
USPC .................................... 716/55, 116, 126, 139
See application file for complete search history.

(56) References Cited

U.S. PATENT DOCUMENTS

| 6,944,842 | B1 * | 9/2005 | Trimberger ................... 716/114 |
| 7,068,666 | B2 * | 6/2006 | Foster et al. .................. 370/397 |
| 7,152,136 | B1 | 12/2006 | Charagulla |
| 7,345,505 | B2 | 3/2008 | Madurawe |
| 7,402,897 | B2 * | 7/2008 | Leedy ............................. 257/678 |
| 7,650,586 | B2 * | 1/2010 | Koga et al. .................... 716/104 |
| 7,701,252 | B1 | 4/2010 | Chow et al. |
| 8,000,106 | B1 | 8/2011 | Patel |
| 8,294,252 | B1 | 10/2012 | Patel |
| 2002/0008309 | A1 | 1/2002 | Akiyama |
| 2008/0309370 | A1 | 12/2008 | Spangaro |

FOREIGN PATENT DOCUMENTS

WO  WO 2006/072142 A1  7/2006

OTHER PUBLICATIONS

K. Puttaswami, G. H. Loh: "Thermal Analysis of a 3D Die-Stacked High-Performance Microprocessor", GLVLSI, Apr., May 2006.

M. J. Alexander et al., "Three-Dimensional Field-Programmable Gate Arrays", in Proc. IEEE Intl. ASIC Conf., Austin, TX, Sep. 1995, pp. 253-256.

Xilinx Inc.: "Spartan 3-AN device", DS557, Sep. 24, 2007.

Notice of Allowance dated Nov. 10, 2009 from U.S. Appl. No. 12/074,467.

(Continued)

*Primary Examiner* — Thuan Do
(74) *Attorney, Agent, or Firm* — Weaver Austin Villeneuve & Sampson LLP (57) ABSTRACT

A programmable device system includes one or more network-on-chip (NoC) die layers vertically connected to one or more programmable chip dice layers. The NoC die layer includes interconnects, a bus or non-blocking switches, and optionally memory blocks and direct memory access engines. The NoC die layer improves on-chip communications by providing fast and direct interconnection circuitry between various parts of the programmable chip die.

21 Claims, 10 Drawing Sheets

(56) References Cited

OTHER PUBLICATIONS

Office Action dated May 19, 2009 from U.S. Appl. No. 12/074,467.
U.S. Appl. No. 12/775,363, filed May 6, 2010, entitled "Stacked Die Network-On-Chip for FPGA" by Francis Man-Chit Chow et al.
Office Action dated Jan. 27, 2012, U.S. Appl. No. 12/775,363.
U.S. Appl. No. 12/775,363, Office Action mailed Jun. 1, 2012.
U.S. Appl. No. 13/294,990, filed Nov. 11, 2011, entitled "Systems and Methods for Stacking a Memory Chip Above an Integrated Circuit Chip" by Richard G. Smolen et al.
U.S. Appl. No. 11/897,916, filed Aug. 31, 2007, entitled "Die Partitioning and Leveraging" by Rakesh H. Patel.

* cited by examiner

| 1 | 2 | 3 | 4 |
|---|---|---|---|
| 5 | 6 | 7 | 8 |
| 9 | 10 | 11 | 12 |
| 13 | 14 | 15 | 16 |

STACKED DIE NETWORK-ON-CHIP FOR FPGA

CROSS-REFERENCE TO RELATED APPLICATIONS

This application is a divisional of and claims the benefit of allowed U.S. nonprovisional patent application Ser. No. 12/074,467 titled "STACKED DIE NETWORK-ON-CHIP FOR FPGA" filed on Mar. 3, 2008, which claims priority to expired U.S. Provisional Patent Application No. 61/002,162, filed Nov. 6, 2007, titled "STACKED DIE NETWORK-ON-CHIP FOR FPGA", all of which are hereby incorporated by reference in their entirety for all purposes.

FIELD OF THE INVENTION

The present disclosure generally relates to programmable logic devices, and more particularly, to the programmable logic device architecture.

DESCRIPTION OF RELATED ART

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, PLDs have improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with Application-Specific Integrated Chips (ASICs) and reduced product development times makes the use of PLDs compelling for many Original Equipment Manufacturers (OEMs).

Many PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), registers for generating registered logic outputs, adders and other circuitry to implement various logic and arithmetic functions. Other PLDs include other blocks such as memory, digital signal processor (DSP), microprocessors and may employ coarse-grained architectures.

As geometry continues to shrink and interconnect delay continues to grow (as a percentage of total delay), a PLD's on-chip communication speed is reaching a plateau. Thus, there exists a need to improve on-chip communications for PLDs to remain competitive with other kinds of logic devices.

SUMMARY OF THE INVENTION

A programmable device incorporates a stacked die having one or more network-on-chip (NoC) die layers interposed adjacent to one or more programmable chip dice layers and connected by vertical connectors. Vertical connectors may be vertical interconnects such as micro bumps, through silicon vias (TSVs), bond pads, or combinations of these. The NoC die layer includes interconnection circuitry connecting different blocks on the programmable chip die and optionally memory blocks and direct memory access (DMA) engines. The interconnection circuitry may include interconnects, a bus or non-blocking interconnect switches, and a communications interface.

In certain embodiments, the programmable device apparatus includes multiple layers of programmable chip die layers with NoC die layers in between. The programmable chip die layer may be a PLD die itself such as an FPGA die or a Complex Programmable Logic Devices (CPLD) die, or a microprocessor die, a memory die, etc.

In another embodiment, a technique of making a programmable device apparatus is provided. Design function and constraints of the apparatus are described by selecting a plurality of dice from a die library. These dice are manufactured and stacked with vertical connections in between. Users then synthesize the description and, after verifying that the dice function as described, place and route on the stacked die device.

These and other features of the present invention will be presented in more detail in the following specification of the invention and the accompanying figures, which illustrate by way of example the principles of the invention.

BRIEF DESCRIPTION OF THE DRAWINGS

The disclosure may best be understood by reference to the following description taken in conjunction with the accompanying drawings, which illustrate particular embodiments of the present invention.

DESCRIPTION OF PARTICULAR EMBODIMENTS

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the apparatus and techniques of the present invention will be described in the context of FPGA die layers. However, it should be noted that the techniques of the present invention can be applied to other programmable chip die layers. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Traditionally, PLDs such as FPGAs are designed and implemented on a monolithic die or wafer. The traditional FPGA die has building blocks including logic elements such as look-up tables (LUT) or adaptive logic modules (ALM), phase locked loops (PLL), distributed memories and large memory blocks, microprocessor cores and other hard IP blocks, digital signal processing (DSP) blocks, input/output cells including high speed serializer/deserializer (SerDes), switches, and routing interconnects. These building blocks in an FPGA chip communicate with each other sending signals through programmable switches and routing interconnects. Routing interconnects and associated switches may take a significant amount of available space on an FPGA die as the number of building blocks increases. As geometry continues to shrink, interconnect delay continues to grow as interconnect becomes narrower and the number of switches increases (number of hops) between source and destination. As a result, on-chip communication speed is reaching a plateau. The future success of FPGA hinges on its ability to continue to deliver comparable performance to Application Specific Integrated Circuits (ASICs) and Application Specific Standard Products (ASSPs) with better flexibility, and therefore there exists a need to improve on-chip communications.

The present disclosure involves an innovative FPGA architecture. Instead of using a monolithic die for the FPGA chip, a separate Network-on-Chip (NoC) die is stacked on a programmable chip die using stack die technology. The NoC die includes fast and direct interconnects serving to bridge communications between various parts of the programmable chip die. The NoC die may contain wide buses and/or non-blocking interconnect switches, and optionally memory blocks and direct memory access (DMA) engines. The programmable chip die may be a traditional FPGA die or a modified FPGA die. For example, an FPGA die may be modified to remove certain routing interconnects and switches whose communication functions may be performed by the NoC die.

The NoC die is connected to the FPGA die using stack die technology. Improvements in stack die technology allow connection between the dice at various points between the die, instead of only at the periphery. In certain embodiments, the dice are connected using micro bumps, bond pads, or through silicon via (TSV) technologies. The innovative FPGA architecture of the present invention does not depend on the particular stack die technology used. Rather, the stack die technology used may be determined based on the stack die technology available and constraints of the design, such as number of connections and cooling requirements.

According to various embodiments, the present disclosure relates to a system of two or more stacked die. The system includes an NoC die layer and a programmable chip die layer, and a number of vertical connectors between the NoC die layer and the programmable chip die layer. These vertical connectors may be micro bumps, bond pads, or TSV. The die may be stacked face to face, back to back, or face to back, depending on the stack die technology. Two programmable chip dice may be stacked on top and below an NoC die, such that the NoC serves to bridge communications between various parts of the same programmable chip die or between the two dice. In certain embodiments, three or more programmable chip dice are stacked with NoC die interposed in between. The NoC die will then bridge communications on the same programmable chip die and adjacent programmable chip die. Information may hop through more than one NoC die.

The NoC die layer includes interconnection circuitry operable to connect the plurality of programmable chip building blocks. In certain embodiments, this interconnection circuitry includes a bus or a number of non-blocking interconnect switches, and a communication interface that may be a time multiplexer, a source synchronous interface, or a high speed serial interface, e.g., low voltage differential signaling (LVDS) transceiver or a serializer/deserializer (SerDes) transceiver. The NoC die layer may also include direct memory access (DMA) engines and memory blocks. The NoC die may be an application specific integrated circuit (ASIC), a traditional FPGA using a LUT implementation, or a mask-programmable gate array. Any device including substantially only interconnect circuitry for routing signals between building blocks of a directly connected programmable chip is referred to herein as an NoC die.

The programmable chip die layer may include building block components such as logic elements, digital signal processing (DSP) blocks, phase lock loops (PLLs), input/output (I/O) cells, memory blocks, microprocessor cores, and other hard IP blocks. The programmable chip die may be partitioned into a number of portions or segments, which may be $2^N$ segments. Each segment may interface separately with the NoC die layer through communication interfaces of different speeds or types.

According to various embodiments memory blocks are included on the NoC die layer or the programmable chip die layer, and in some cases, memory blocks are split between the two or more layers. In other cases, memory blocks are all on one die layer. These memory blocks may also be connected directly to external components or certain internal components via dedicated connections. The memory blocks may be implemented as static random access memory (SRAM), dynamic random access memory (DRAM), flash memory, content addressable memory (CAM), ternary content addressable memory (TCAM) or any other memory technology. Additionally, parts of the memory blocks may be implemented using different memory technologies.

In one embodiment, the present disclosure pertains to a technique for manufacturing a system of two or more stacked die layers. Design functionality is described or specified for the system. The description may be in a form of a program in a programming language. A number and type of programmable chip die layers are selected from a library of available programmable chip die layers. The library may contain programmable chip die layers having specific properties, e.g., functions, specific optimization, logic capacity, memory, or dimensions. For example, one programmable chip die layer is focused on logic-rich applications and another is focused on digital signal processing (DSP)-rich and yet another focused on memory-rich applications. Some programmable chip die layers are optimized for both DSP-rich and memory-rich applications. In particular examples, a programmable chip die has 19,000 adaptive logic modules (ALMs), 48,000 equivalent logic elements (LEs), 38,000 registers, and 108 memory blocks, while another has 101,760 ALMs, 254,400 LEs, 203,520 registers, and 864 memory blocks. The programmable chip die may be selected by a designer based on an algorithm.

A number and type of NoC die layers may also be selected from a library of available NoC die layers. According to particular embodiments, the library contains NoC die layers designed for use with specific programmable die chip layers, for specific numbers of segments partitioned, type and number of memory blocks, and use a specified type of communication interface, e.g., SerDes or LVDS. The selected die layers may be connected using connectors, e.g., TSV interconnects, micro bumps, bond pads, or a combination of these. The technique also includes placing and routing the design functionality onto the die layers, which may occur with individual die layers before they are connected or after all die layers have been connected.

The present disclosure as described has many benefits. First, the interconnect delay bottleneck is removed or reduced. As geometries shrink, traditional FPGA routing fabric faces increasing interconnect delay for on-chip communications, thus reducing the benefits of the geometric shrinkage. The reduction in interconnect delay extends the benefits of the geometric shrinkage. The performance of the FPGA also improves as the maximum number of hops is reduced between source and destination. The reduced number of hops allows an FPGA to run at a higher frequency.

Next, the logic capacity may increase without increasing die size or decreasing geometry. As some interconnect logic and some memory are placed on the NoC die, less routing and memory is required on the FPGA die. The reduction for global routing and memory blocks allows more logic elements to be placed on the FPGA die layer. On the other hand, if logic capacity increase is not necessary, the die size may be reduced. In some cases, older, less expensive, semiconductor technology may be used.

Another benefit is an increase in memory bandwidth. The use of memory on the NoC die instead of external to the FPGA chip reduces power consumption and latency. The use of a high speed serial interface further enhances the memory bandwidth of the system. System resource allocation also improves. Traditionally, logic can only make use of memory blocks that are close to them for high speed applications. With an NoC die layer, this restriction is removed and logic may use any memory on the NoC die layer, thus improving flexibility in implementing solutions.

Lastly, a highly customizable platform solution becomes available. Various types of die may be stacked using one or more NoC die layers. Based on the application requirement, one can stack two FPGA dice together or one FPGA die with an ASIC functional die. Other variations are possible, for example, separate memory die may be used.

Figure 1A:
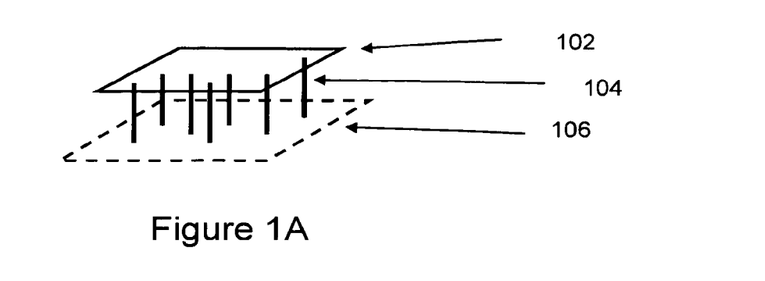
FIG. 1A-C illustrates various stacked configurations of die layers and vertical connectors.
Figure 1B:
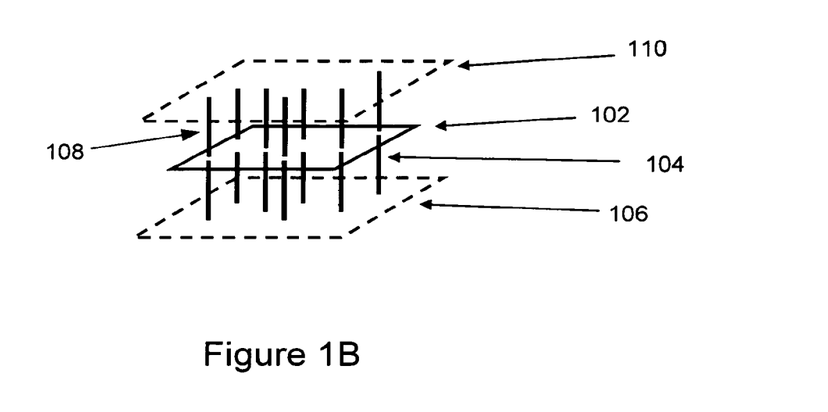
Figure 1C:
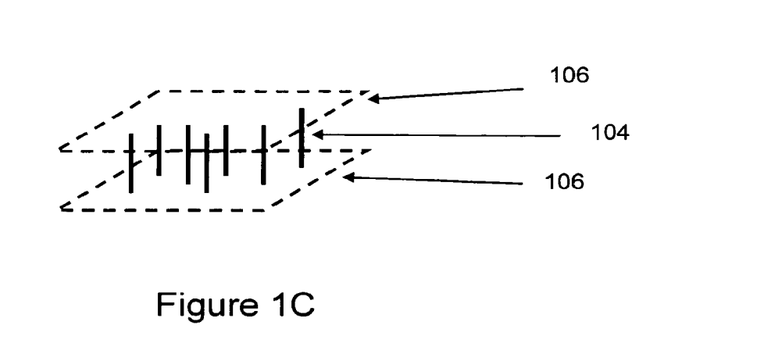

FIG. 1A-1C depicts various possible configurations of the present invention. In FIG. 1A, NoC die layer 102 is connected to a programmable chip die layer 106 with vertical connectors 104. As depicted, vertical connectors 104 couple the two die layers at various locations. According to various embodiments, the location of these various connections depend on the number of segments partitioned on the programmable chip die and/or signal routing or speed requirements between different building blocks of the programmable chip die 106. Each vertical connector need not be the same or carry signals in the same way. For example, a connector may include more than one interconnect carrying signal between the die layers or only one interconnect. Different transceivers may be used, depending on the segment connected.

FIG. 1B shows the configuration of FIG. 1A, with an additional layer of programmable chip die 110 and corresponding vertical connectors 108. Although connectors 104 and 108 are shown to be vertically linear and perpendicular to the plane of the die, they need not be. The programmable chip die layer 110 may be partitioned differently from die layer 106, and thus the connectors may be located in different places. In FIG. 1C, two programmable chip dice layers 106 are connected by vertical connectors 104. In this configuration, the programmable chip die layers may be programmed to perform different functions. One of the die layers 106 may be programmed to function as an NoC die layer. In another embodiment, the vertical connectors 104 are direct connections between various segments of different programmable chip die. This strategically reduces the interconnect delay of a planar implementation by, for example, making available memory blocks directly above or below a stacked die in addition to those close by.

Figure 2:
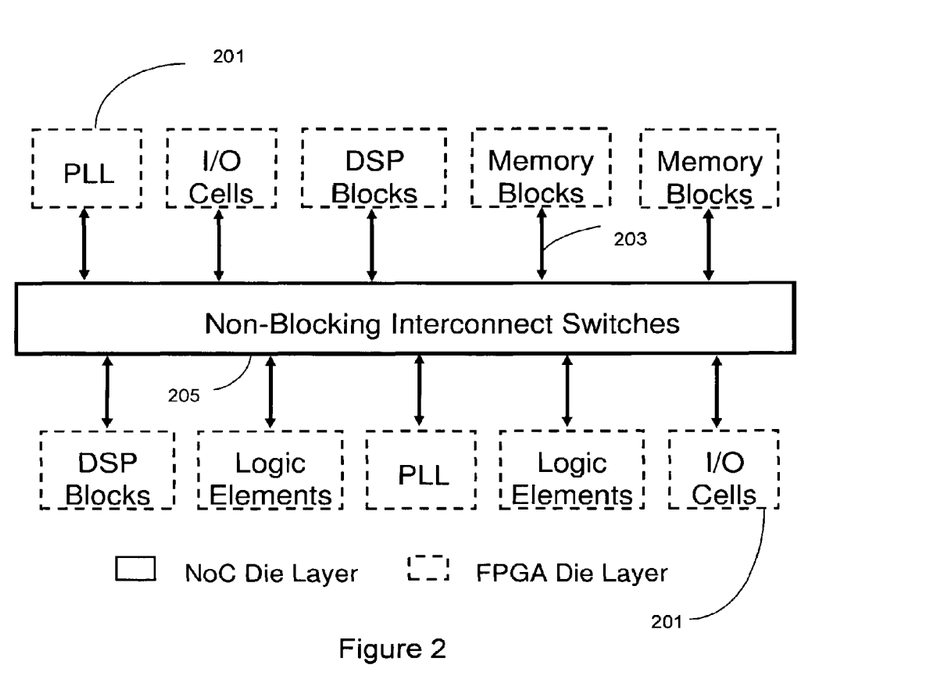
FIG. 2 illustrates a schematic of various building blocks on an NoC die layer and a programmable chip die layer.

FIG. 2 shows a schematic of various building blocks on an NoC die layer and programmable chip die layer. Building blocks 201 on an FPGA die layer are shown with a dotted line box. Each building block 201 on the FPGA die layer are connected to the non-blocking interconnect switches 205 of the NoC die layer by connectors 203. Connectors 203 may be vertical interconnects and may be time multiplexed, source synchronous or serial. According to various embodiments, the non-blocking interconnect switches 205 is one building block of the NoC die layer, represented by a solid line box. Other NoC building blocks may be included on the NoC die layer. The building blocks 201 may be on one FPGA die layer or more than one FPGA die layer, and may include PLLs, I/O cells, DSP blocks, memory blocks, microprocessor cores or other hard IP blocks, or logic elements. As shown, several building blocks of the same type may be connected separately to the switches 205. The switches 205 may represent one or more switches in the NoC die layer.

Figure 3:
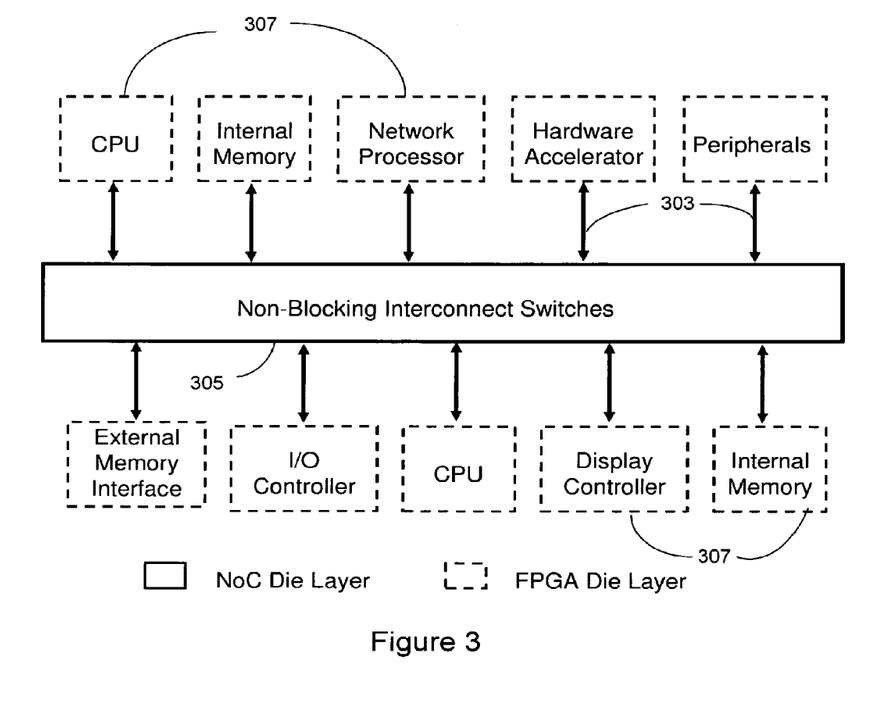
FIG. 3 illustrates a schematic of various functional blocks on an NoC die layer and a programmable chip die layer.

FIG. 3 shows a schematic of various functional blocks on an NoC die layer and programmable chip die layer. Functional blocks 307 on an FPGA die layer are shown with a dotted line box. Each functional block 307 on the FPGA die layer are connected to the non-blocking interconnect switches 305 of the NoC die layer by connectors 303. According to particular embodiments, the functional blocks 307 are on one FPGA die layer or more than one FPGA die layer, and are CPUs, internal memory, network processor, hardware accelerator, peripherals, external memory interface, I/O controller, or display controller. As shown, several functional blocks of the same type may be connected separately to the switches 305.

Figure 4A:
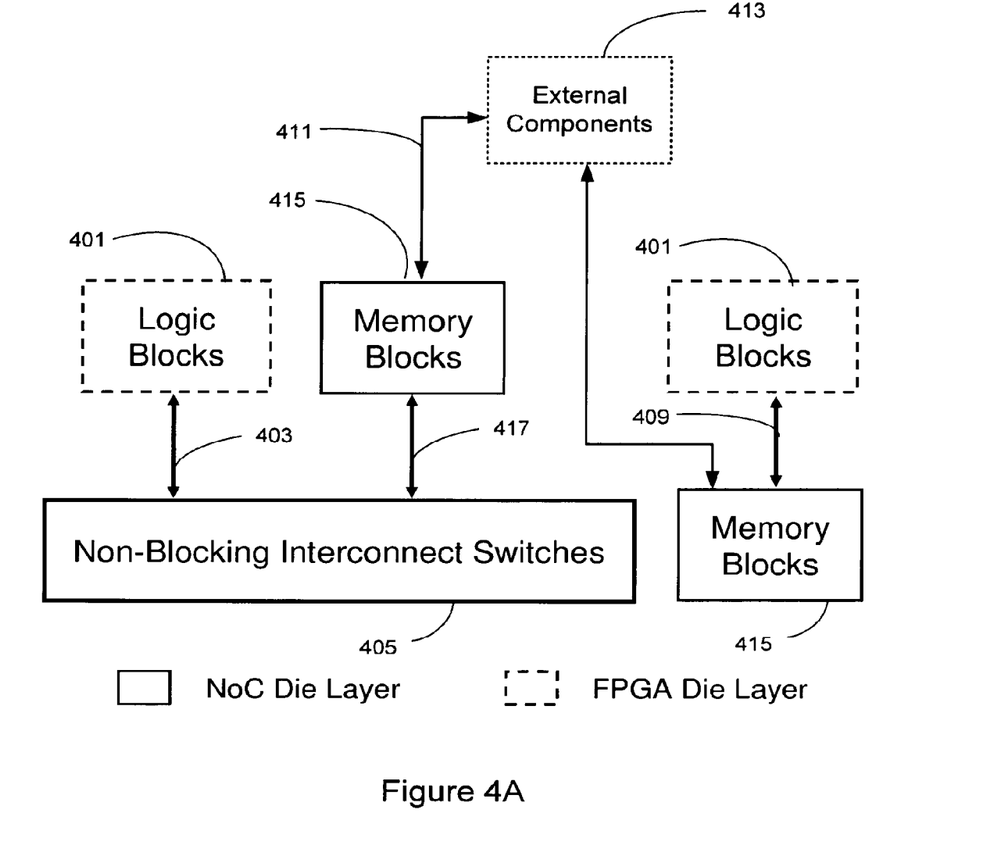
FIGS. 4A and 4B illustrate examples where internal memory blocks are incorporated into the NoC die layer.
Figure 4B:
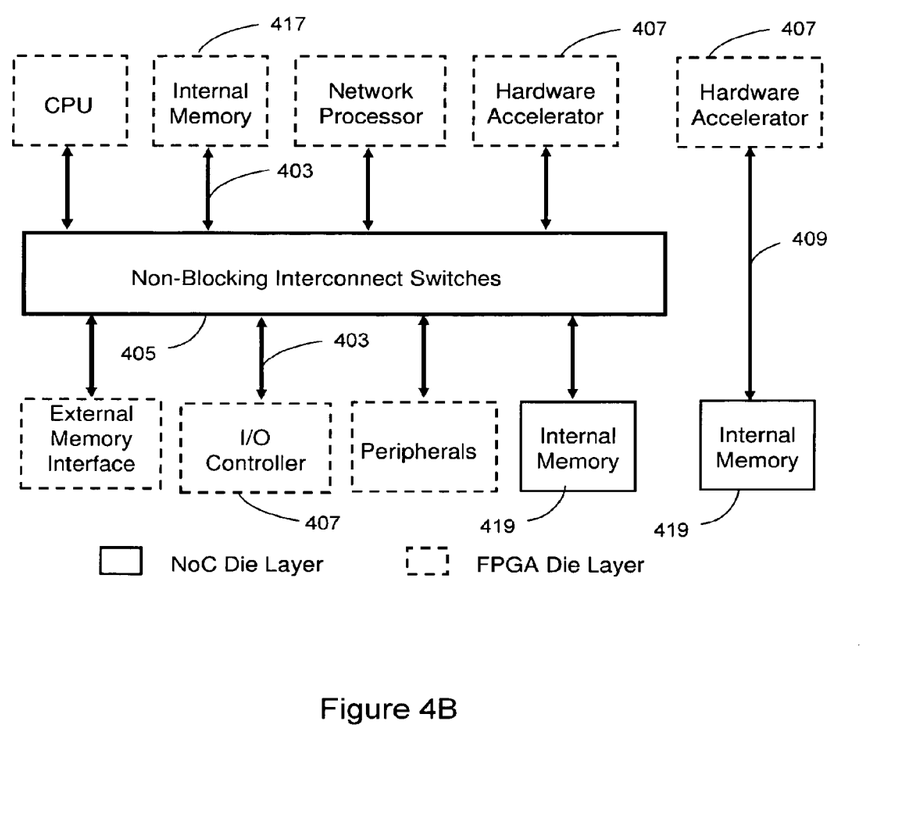

The NoC layer can also include one or more individually addressable memory blocks. FIGS. 4A and 4B show schematics showing where internal memory blocks are incorporated into the NoC die layer. Logic blocks 401 on the FPGA die layer are connected to non-blocking interconnect switches 405 on the NoC die layer via vertical interconnects 403. Memory block 415 is connected to the switches 405 with connector 417, which is on the same die. FIG. 4A also shows memory block 415 being connected directly through connector 409 to logic blocks 401 on the FPGA die layer. Thus memory blocks 415 may connect to logic blocks through switches 405 on the NoC die layer or directly through a dedicated connection 409. The NoC die layer can contain high speed serial I/O 411 such as transceivers that are connected directly to these memory blocks. The memory blocks can then also be used by hardware 413 that is external to the chip through these I/O cells. The high speed serial I/O can be a transceiver or high speed LVDS or any other serial interface.

Memory blocks 415 may be homogeneous, having the same width and depth, or they may be heterogeneous, have one or both different widths and depths. Note that the memory blocks can be implemented as SRAM, DRAM, flash, CAM, TCAM or any other memory technology.

FIG. 4B shows an FPGA implementation of the concept in FIG. 4A. The FPGA includes functional blocks 407 such as CPUs, network processors, hardware accelerators, peripherals, display controllers, I/O controllers, internal memories, and external memory interfaces. The functional blocks 407 are connected to non-blocking interconnect switches 405 on the NoC die layer. Buses and interconnect switches on the NoC layer serve as high-speed communication hub for all the functional blocks in the FPGA layer. In this implementation, internal memory is located on both the FPGA die layer (see box 417) and the NoC die layer (see box 419). The internal memory blocks 419 are connected directly and indirectly to a hardware accelerator through a dedicated connection 409. Note that not just the hardware accelerator may have a dedicated connection to the internal memory—other functional blocks may also be directly connected to the same or different memory block. As discussed above, the memory block may also be connected directly to an external hardware. The multiple possible placements for internal memories add flexibility to the design and add another variable option to optimize the system.

Figure 5:
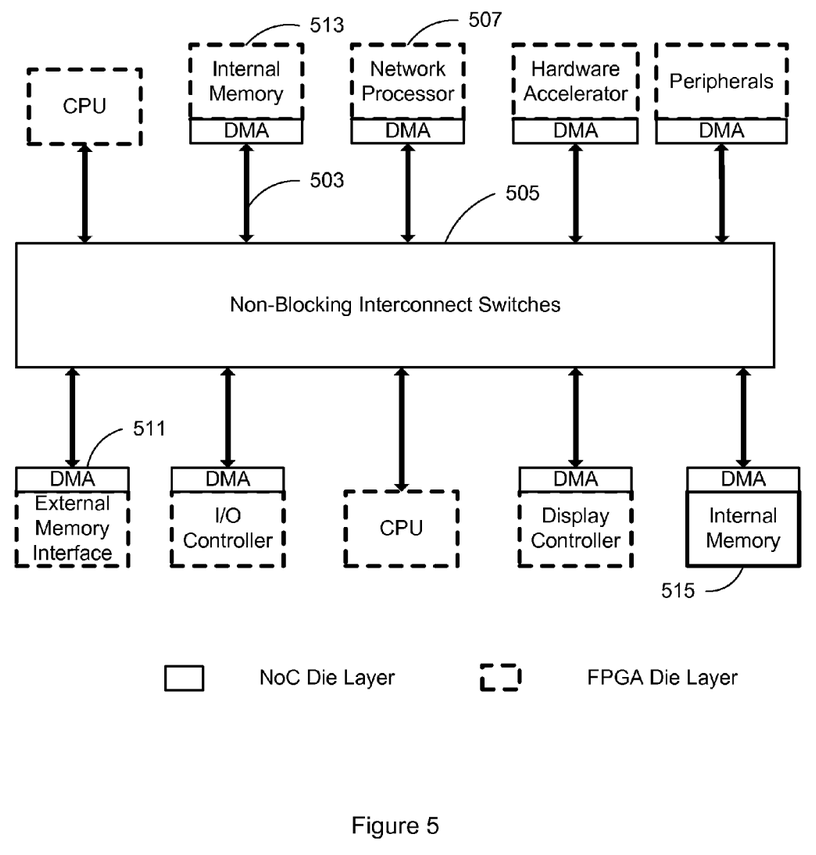
FIG. 5 illustrates a schematic of one example where DMA engines are incorporated onto the NoC die layer.

FIG. 5 shows direct memory access (DMA) engines 511 as additional functional blocks on the NoC layer. DMA engines allow certain blocks in the FPGA and external components to access internal memory for reading and/or writing independently of the central processing unit (CPU) block. System architecture with DMA engines can transfer data to and from functional blocks with much less CPU overhead than without DMA engines. The DMA engines initiate data transfers and manage traffic flows. As shown in FIG. 5, each functional block 507 on the FPGA die layer, except for the CPU, has a corresponding DMA engine 511 on the NoC die layer. The CPU can access the internal memory directly without a DMA engine. The internal memory may be located on the FPGA layer, such as 513, or on the NoC die layer, such as 515.

Figure 6:
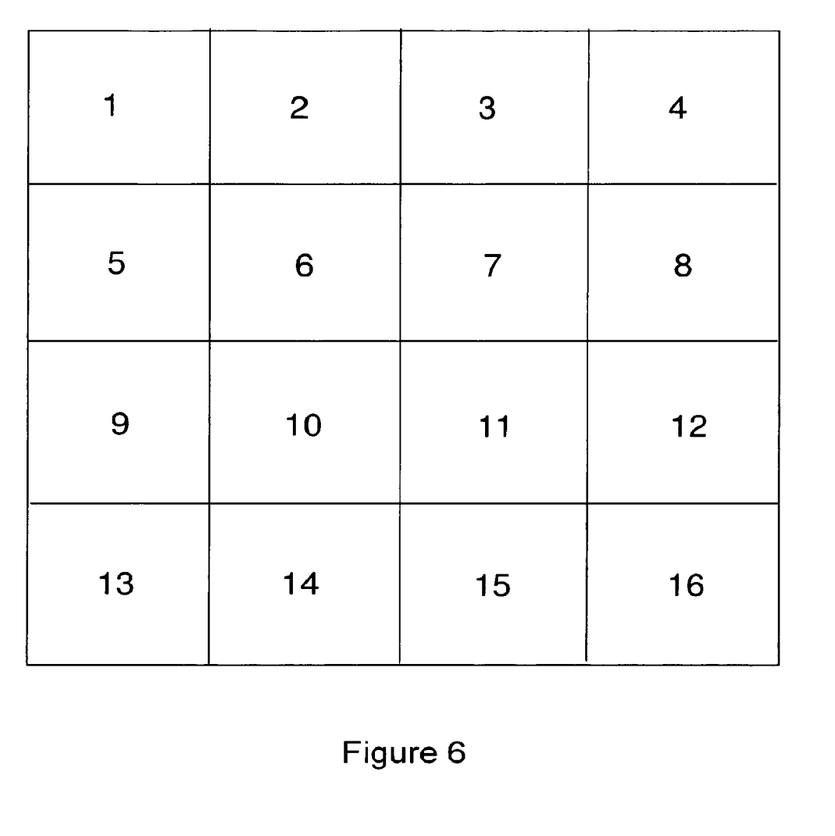
FIG. 6 illustrates an example partition of a FPGA die into 16 segments.

Vertical connectors may be placed at various locations in between the die layers to be connected. It should be noted that a vertical connector does not have to be entirely or perfectly vertical. According to particular embodiments, any connector having a substantial vertical component allowing connection or stacked dies is referred to herein as a vertical connector. These 3D vertical interconnects may connect a segment, or a partition, of an FPGA die layer with interconnect switches on the NoC die layer. The FPGA die layer may be partitioned into $2^N$ segments, where N is 2 or larger. The FPGA die layer may be partitioned into 4, 8, 16, 32, or more segments. FIG. 6 shows an FPGA die layer 601 partitioned into $2^N$ segments, where N is 4. The size of each partition needs not to be identical to the others, although approximately equal sizes tend to yield higher implementation efficiency. However, the sizes of the partition need not be equal and the partitions can be heterogeneous.

For each segment, at least one set of signals are connected using 3D vertical interconnects between the FPGA die layer and the NoC die layer. A typical bus contains signals including Address, Data, Read/Write, Data Ready and Data Valid. Other bus may contain more signals, such as Refresh, Interrupt Request, and DMA acknowledge and request. The width of these signals can vary depending on the requirements of the design. The most common data width is 16, 32 or 64-bits, although narrower or wider widths may be used. These signals may also be transmitted using a high-speed serial interface such as LVDS transceiver or SerDes transceiver.

Additionally, the speed, width, and type of signal transmission, whether by bus or by high-speed serial interface, need not be the same between every FPGA segment and the NoC die layer. It is possible to have, on segment 1, a bus connection between the die layers and on segment 16 a serial connection, each with a different capacity and speed. Thus, the communication interface from each segment may be optimized according to the requirements of that segment, e.g., a network processor requiring higher speed or memory blocks requiring higher capacity.

Figure 7A:
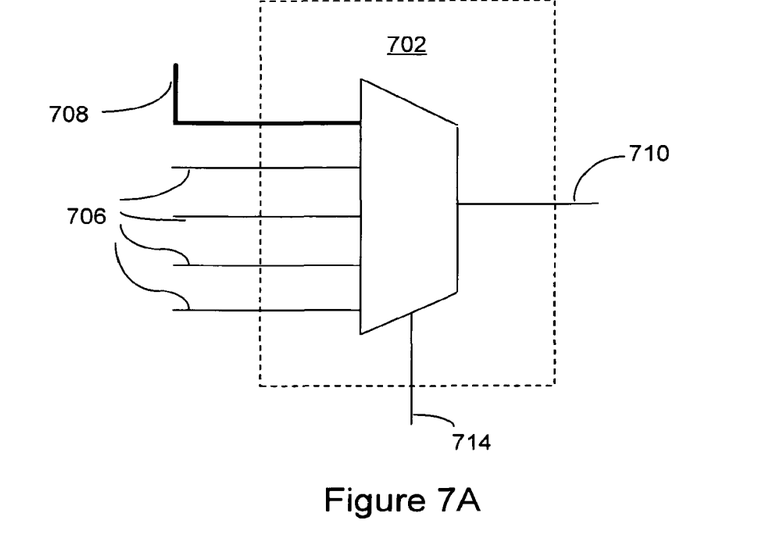
FIGS. 7A and 7B are logical representations of 3-D switch designs for a stack die architecture.
Figure 7B:
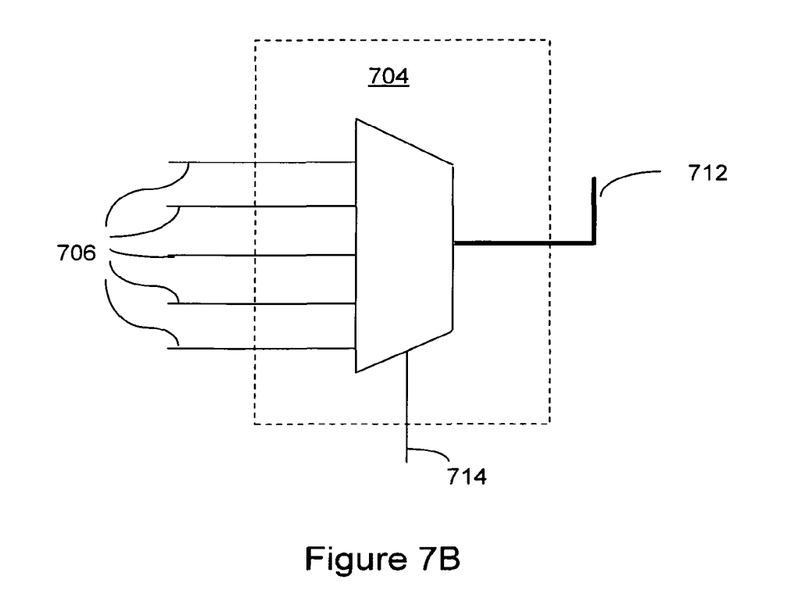

In order to implement the 3D vertical connectors between the die layers, 3-D switches are used on the FPGA. Traditional FPGA have two-dimensional, or planar, switches for routing and interconnects. According to various embodiments, a new switch design to implement the 3D vertical interconnects incorporate a vertical input or output as shown in FIGS. 7A and 7B. FIG. 7A shows a multiplexer type switch 702 with a vertical input 708 and four planar inputs 706. This switch receives a signal from the NoC die layer from the vertical input 708, multiplexes it with the planar inputs 706 from the FPGA with select signal 714, and outputs a planar output signal 710. FIG. 7B shows a multiplexer type switch 704 with five planar inputs 706. This switch may multiplex the five planar inputs 706 based on the select signal 714 and output to a vertical output 712. In FIG. 7B, signals are going from the FPGA die layer to the NoC die layer so that the 3D vertical signal is an output of the multiplexer.

According to various embodiments, corresponding 3-D switches are implemented on the NoC die layer with vertical inputs and/or outputs. The NoC die layer also includes non-blocking interconnect switches. A typical non-blocking interconnect switch uses crossbar interconnection where each output connects to one input. A central arbiter may be used to schedule the signals crossing the switches to maximize throughput of each crossbar input or output. Alternatively, numerous arbiters can be used.

The NoC die layer and the programmable chip die layer can use a variety of interconnection fabrics. For example, a slave side arbitration fabric may be used. Any system level mechanism used to connected master and slave components is referred to herein as an interconnection fabric or bus. Any component or device that is operable to initiate read and write operations by providing control information is referred to herein as a master component. Any component or device that responds to read or write operations with information sent back to the master component regarding the read or write operation is referred to herein as a slave component. Control information can include a particular address associated with a slave component.

Some examples of master components are processors, microcontrollers, and Ethernet devices. Some examples of slave components are Universal Asynchronous Receiver Transmitters (UARTs), Parallel Input Output (PIO), program memory, and data memory. It should be noted that some components such as an Ethernet component can be both a master component and a slave component, as an Ethernet component has the capability of reading and writing to the slave program memory while also responding to instructions from a master system CPU.

The multiple master and slave components are connected using slave side arbitration, simultaneous multiple master components, or simultaneous multiple masters. A system using individual arbitrators that correspond to individual slave components accessible by more than one master component is referred to herein as a slave side arbitration system. Any component or device that is configured to ensure that only one master component can access any one of the slave components at any given time is referred to herein as a system bus arbitrator or bus arbitration logic. Various schemes such as weighted fairness can be implemented to improve the efficiency of slave component access, but such schemes can increase system complexity and latency. In conventional implementations, a computer system includes a single system bus arbitrator for each bus in the computer system.

A slave side arbitration system no longer requires a bus or a system bus arbitrator that prevents a second master component from accessing a second slave component when a first master component is accessing a first slave component. According to various embodiments a slave component such as a peripheral interface is associated with a slave side arbitrator. Logic and mechanisms for selecting an input based on a bus control signal are referred to herein as an arbitrator or arbitration logic. It should be noted that although switching circuitry generally can be implemented using multiplexers, a variety of mechanisms including switches and transistors can be used.

However, slave components such as a UART and a PIO are not associated with any arbitrator. In one example, a slave component UART and a slave PIO can only be accessed by a master CPU and not by a master Ethernet device. A peripheral interface, however, can be accessed by both a master CPU and a master Ethernet device.

According to various embodiments, a slave side arbitrator allows a first slave component in a system to be accessed by a first master component at the same time a second slave component in the system is accessed by a second master component. For example, a peripheral interface can be accessed by a master Ethernet through a slave side arbitrator at the same time a slave UART is accessed by master CPU.

By allowing a CPU to access a slave component at the same time another master component such as a streaming output device or an Ethernet component is accessing memory, bus bottlenecks can be reduced. By using the simultaneous multiple master component architecture, more direct connections between components can also be supported.

Although slave side arbitrators provide many benefits to programmable chip designers, arbitration logic efficiency is still needed to prevent performance degradation. It is also beneficial to provide priority considerations and fairness with any arbitration logic, slave side arbitration logic or otherwise. According to various embodiments, port adapters available from a port adapter library can be connected serially to slave side or slave side arbitrators.

Figure 8:
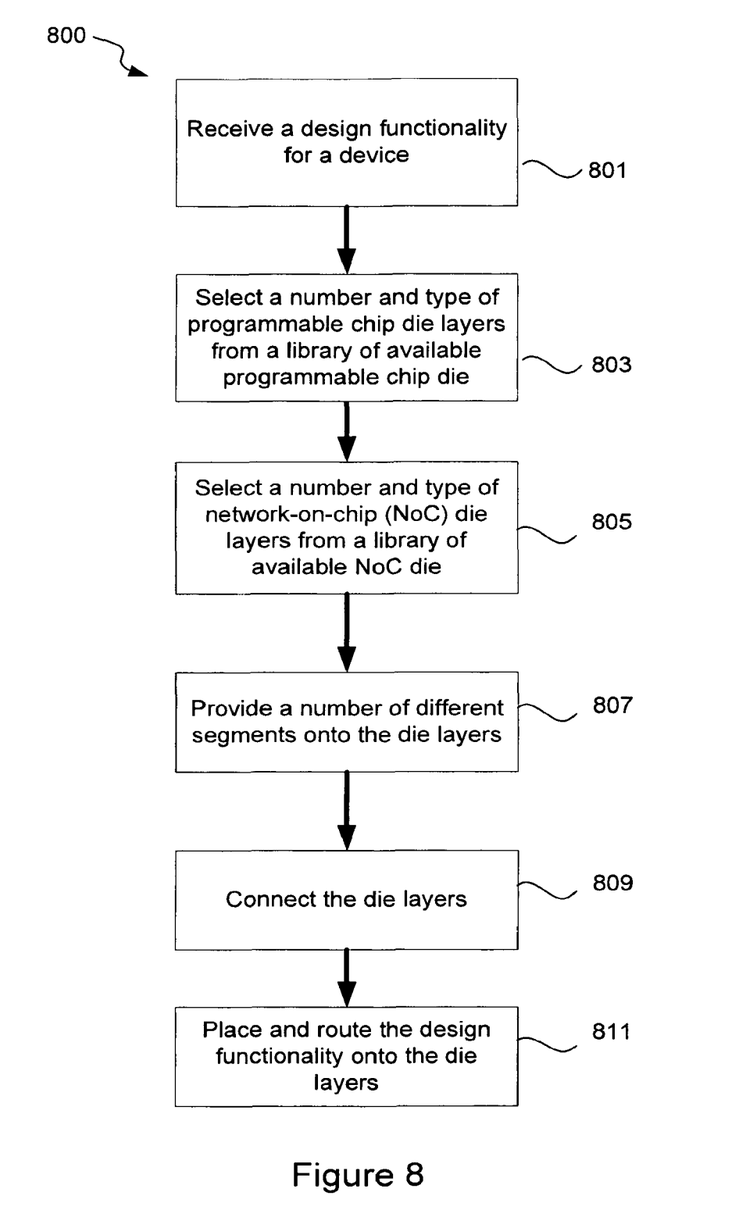
FIG. 8 is a process flow diagram depicting the design and manufacturing process for the stack die FPGA with an NoC die.

According to various embodiments, the technique for making the stack die layer device is provided. FIG. 8 is a process flow diagram 800 showing particular operations. A design functionality for a device is received in operation 801. This design functionality may be described in a programming language such as a hardware description language or be described with a schematic design. Common hardware description languages include Very-High-Speed Integrated Circuits Hardware Description Language (VHDL), System Verilog, System C, and Verilog. The design functionality describes the behavior desired of the device.

The hardware description is used to create a customized solution. In certain embodiments, a number and type of programmable chip die layers are selected from a library of available programmable chip dice at operation 803. The library contains programmable chip dice having specific properties, having a focus on certain type of applications, or specific capacity in various functional blocks. These specific properties may include functions, specific optimization, logic capacity, memory, cost, or dimensions. The specifications of the available programmable chip dice may include number of logic elements, registers, number of multipliers and other DSP functions, or memory blocks. Other embodiments may have a pre-processing step that can include operations like logic synthesis followed by fast placement and routing or other appropriate means to evaluate the different resources required by the design implementation before selecting the number and type of programmable chip die layers and NoC die layers from the respective libraries.

A number and type of NoC dice layer may also be selected from a library of available NoC dice in operation 805. The library may include NoC dice designed for use with specific programmable chip die layers, number of segments, type of communication interface, and may include a specific type and number of memory blocks. As discussed above, the communication interface on the NoC may be heterogeneous, depending on the segments connected. The library may also include NoC die for use with more than one programmable chip die layer or one optimized for a specific stack die technology.

A number of different segments are provided with the die layers in operation 807. The segments may be about the same size or of different sizes. These segments may be building blocks or functional blocks as discussed above (e.g., memory, DSP, transceivers, I/O, SerDes, microprocessors and other hard IP blocks) and are not limited to the programmable chip die layer. The NoC die layer may also contain multiple segments, such as memory blocks, non-blocking interconnect switches, or even I/O cells.

The layers are connected in operation 809 using through silicon via interconnects, micro bumps, bond pads, or a combination of these. A limitation on the type of connector used may be the available stack die technology for the communication interface. Once the dice are stacked together, traditional FPGA design is implemented on the stacked die FPGA. A design is compiled and placed and routed to the FPGA die layer, or to both the FPGA and the NoC die layer if there is some programmability on the NoC die layer at operation 811.

In an alternate embodiment, the device design is partitioned into subsets where each subset is implemented on a separate layer. However, the physical design step at each layer preferably has information about the result of the physical design step at other layers for guiding placement and routing if it is done separately for every layer. Concurrent placement and routing of the design on all layers increases the complexity of the physical design step, but has the potential of yielding superior solutions in terms of performance and power consumption.

Figure 9:
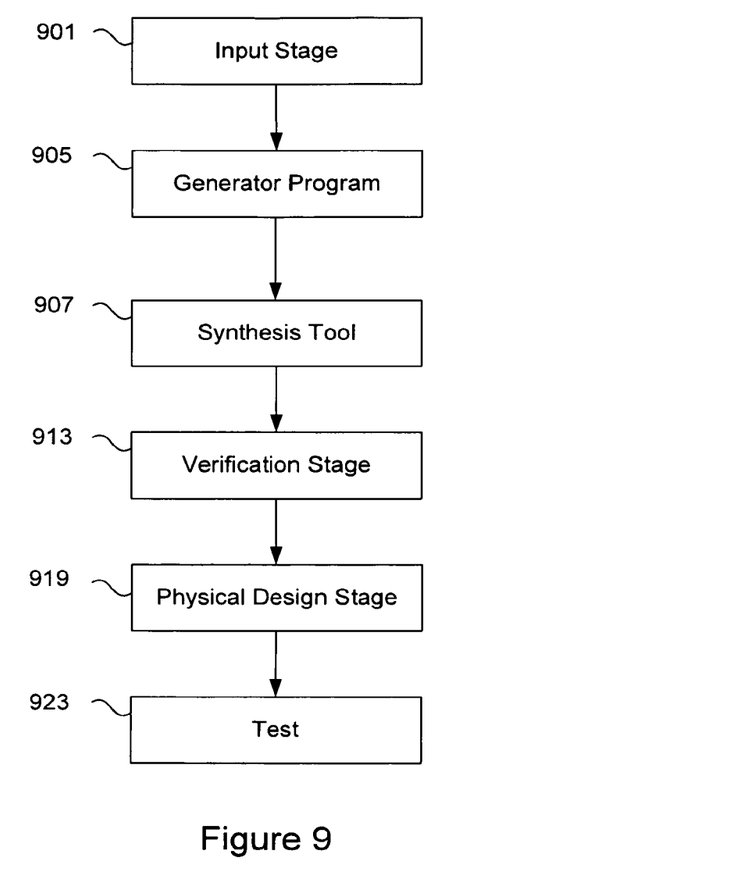
FIG. 9 is a process flow diagram depicting the design and manufacturing process for one die layer.

FIG. 9 is a diagrammatic representation showing a FPGA design implementation. An input stage 901 receives selection information typically from a user for logic such as a processor core as well as other components such as a streaming output device to be implemented on an electronic device. In one example, the input received is in the form of a high-level language program. A generator program 905 creates a logic description and provides the logic description along with other customized logic to any of a variety of synthesis tools, place and route programs, and logic configuration tools to allow a logic description to be implemented on an electronic device. Result of stage 901 may be used in stage 801 as input for selecting the die layers.

In one example, an input stage 901 often allows selection and parameterization of components to be used on an electronic device. The input stage 901 also allows configuration of variable or fixed latency support. In some examples, components provided to an input stage include intellectual property functions, megafunctions, and intellectual property cores. The input stage 901 may be a graphical user interface using wizards for allowing efficient or convenient entry of information. The input stage may also be a text interface or a program reading a data file such as a spreadsheet, database table, or schematic to acquire selection information. The input stage 901 produces an output containing information about the various modules selected.

In typical implementations, the generator program 905 can identify the selections and generate a logic description with information for implementing the various modules. The generator program 905 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 905 identifies pointers and provides ports for each pointer. One tool with generator program capabilities is System on a Programmable Chip (SOPC) Builder available from Altera Corporation of San Jose, Calif. The generator program 905 also provides information to a synthesis tool 907 to allow HDL files to be automatically synthesized. In some examples, a logic description is provided directly by a designer. Hookups between various components selected by a user are also interconnected by a generator program. Some of the available synthesis tools are Quartus Integrated Synthesis (QIS) from Altera Corporation of San Jose, Calif., Precision Synthesis, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 901, generator program 905, and synthesis tool 907 can be separate programs. The interface between the separate programs can be a database file, a log, or simply messages transmitted between the programs. For example, instead of writing a file to storage, the input stage 901 can send messages directly to the generator program 905 to allow the generator program to create a logic description. Similarly, the generator program can provide information directly to the synthesis tool instead of writing HDL files. Similarly, input stage 901, generator program 905, and synthesis tool 907 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDIF file). An EDIF file is one example of a synthesized netlist file that can be output by the synthesis tool 907.

A synthesis tool 907 can take HDL files and output EDIF files or other netlist description formats such as structural VHDL or structural Verilog. Tools for synthesis allow the implementation of the logic design on an electronic device. Various synthesized netlist formats will be appreciated by one of skill in the art.

A verification stage 913 may precede or follow the synthesis stage 907. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 913, the synthesized netlist file can be provided to physical design tools 919 including place and route and configuration tools. A place and route tool typically locates logic cells on specific logic elements of a target hardware device and connects wires between the inputs and outputs of the various logic elements in accordance with logic required to implement an electronic design. This is usually followed by a final timing analysis step to sign off on the timing constraints, now that all the actual timing paths between sequential elements on the device are known. The device can also be physically tested at 923.

For programmable logic devices, a programmable logic configuration stage can take the output of the place and route tool and generate a bit stream that is used to program the logic device with the user selected and parameterized modules. According to various embodiments, the place and route tool and the logic configuration stage are provided in the Quartus Development Tool, available from Altera Corporation of San Jose, Calif.

As noted above, different stages and programs can be integrated in a variety of manners. According to one embodiment, the input stage 901, the generator program 905, the synthesis tool 907, the verification tools 913, and physical design tools 919 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDIF files are mere examples of a logic description. Other file formats as well as internal program representations are other examples of a logic description.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof; it will be understood by those skilled in the art that changes in the form and details of the disclosed embodiments may be made without departing from the spirit or scope of the invention. For example, although FPGA dice are used in the various examples and figures, the present invention is not limited to an implementation involving an FPGA die as the programmable chip die. The present invention contemplates the use of other types of programmable chip die such as microprocessor die, Complex Programmable Logic Devices (CPLD) die, or memory die. In another example, the present invention may be practiced with a type of types vertical connector and connection methods not discussed above. It is envisioned that the present invention may be practiced using new and as yet unknown vertical connectors as stack die technology advances. It is therefore intended that the invention be interpreted to include all variations and equivalents that fall within the true spirit and scope of the present invention.

What is claimed is:

1. A method of making a device, the method comprising:
   receiving, at a computer system, a design;
   selecting, based on the design, at least one field programmable gate array (FPGA) die layer from an FPGA library;
   selecting at least one network-on-chip (NoC) die layer from a NoC library; and
   connecting the at least one FPGA die layer and the at least one NoC die layer, wherein the FPGA die layer includes a multiplexer, the multiplexer having a first input provided by the NoC die layer, a second input provided by the FPGA die layer, and an output implemented in the FPGA die layer.

2. The method of claim 1, wherein the connecting includes electrically connecting the at least one FPGA die layer to the at least one NoC die layer.

3. The method of claim 2, wherein the electrically connecting comprises forming through silicon vias between the at least one NoC and the at least one FPGA die layers.

4. The method of claim 1, further comprising:
   logic synthesizing based on the design;
   placing and routing a plurality of logic cells on a plurality of logic elements of the device;
   verifying a plurality of timing constraints of the device; and
   programming the connected die layers.

5. The method of claim 1, further comprising:
   receiving a signal from the at least one NoC die layer; and
   outputting a planar output signal by multiplexing the signal with a planar input received from the at least one FPGA die layer.

6. The method of claim 1, further comprising:
   receiving a plurality of planar input signals;
   generating a vertical output signal by multiplexing the plurality of planar input signals, wherein the multiplexing is performed based on a select signal; and
   outputting the vertical output signal to the at least one NoC die layer.

7. The method of claim 1, further comprising implementing a plurality of 3-D switches on the at least one NoC die layer.

8. The method of claim 1, further comprising using a plurality of 3-D vertical interconnects to connect a segment of the at least one FPGA die layer with an interconnect switch on the at least one NoC die layer.

9. The method of claim 1, further comprising creating a plurality of segments by segmenting the at least one FPGA die layer.

10. The method of claim 9, wherein each segment has the same size or at least one segment of the plurality of segments has a different size than the remaining segments of the plurality of segments.

11. The method of claim 1 further comprising:
    at least one of a plurality of connectors connecting the NoC die layer and the FPGA die layer, wherein the NoC die layer includes interconnection circuitry operable to connect the FPGA die layer.

12. A device made and used by the process of:
    receiving a design of the device;
    selecting, based on the design, at least one field programmable gate array (FPGA) die layer from an FPGA library;
    selecting at least one network-on-chip (NoC) die layer from a NoC library; and
    connecting the at least one FPGA die layer and the at least one NoC die layer, wherein the FPGA die layer includes a multiplexer, the multiplexer having a first input provided by the NoC die layer, a second input provided by the FPGA die layer, and an output implemented in the FPGA die layer.

13. The device of claim 12, made by the connecting that includes electrically connecting the at least one FPGA die layer to the at least one NoC die layer.

14. The device of claim 12, made by the electrically connecting that includes forming through silicon vias between the at least one NoC and at least one FPGA die layers.

15. The device of claim 12, further made by the process of:
    logic synthesizing based on the design;
    placing and routing a plurality of logic cells on a plurality of logic elements of the device;
    verifying a plurality of timing constraints of the device; and
    programming the connected die layers.

16. The device of claim 12, further used by the process of:
    receiving a signal from the at least one NoC die layer; and
    outputting a planar output signal by multiplexing the signal with a planar input received from the at least one FPGA die layer.

17. The device of claim 12, further used by the process of:
    receiving a plurality of planar input signals;
    generating a vertical output signal by multiplexing the plurality of planar input signals, wherein the multiplexing is performed based on a select signal; and
    outputting the vertical output signal to the at least one NoC die layer.

18. The device of claim 12, further made by the process of implementing a plurality of 3-D switches on the at least one NoC die layer.

19. The device of claim 12, further made by the process of using a plurality of 3-D vertical interconnects to connect a segment of the at least one FPGA die layer with an interconnect switch on the at least one NoC die layer.

20. The device of claim 12, further made by the process of creating a plurality of segments by segmenting the at least one FPGA die layer.

21. The device of claim 20, wherein each segment has the same size or at least one segment of the plurality of segments has a different size than the remaining segments of the plurality of segments.

* * * * *